(12) United States Patent
Ramalingam et al.

(10) Patent No.: US 11,572,618 B2
(45) Date of Patent: Feb. 7, 2023

(54) METHOD AND CHAMBER FOR BACKSIDE PHYSICAL VAPOR DEPOSITION

(71) Applicant: Applied Materials, Inc., Santa Clara, CA (US)

(72) Inventors: Jothilingam Ramalingam, Milpitas, CA (US); Xiaozhou Che, Sunnyvale, CA (US); Yong Cao, San Jose, CA (US); Shane Lavan, Palo Alto, CA (US); Chunming Zhou, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/003,969

(22) Filed: Aug. 26, 2020

(65) Prior Publication Data

US 2021/0062325 A1    Mar. 4, 2021

Related U.S. Application Data

(60) Provisional application No. 62/892,411, filed on Aug. 27, 2019.

(51) Int. Cl.
*C23C 14/35*         (2006.01)
*H01L 21/02*         (2006.01)
(Continued)

(52) U.S. Cl.
CPC .......... *C23C 14/35* (2013.01); *C23C 14/0652* (2013.01); *H01J 37/32082* (2013.01);
(Continued)

(58) Field of Classification Search
None
See application file for complete search history.

(56) References Cited

U.S. PATENT DOCUMENTS 4,842,707 A * 6/1989 Kinoshita ............... C23C 14/32
                                                       118/723 E
5,096,536 A * 3/1992 Cathey, Jr. ........ H01J 37/32431
                                                       118/724
(Continued)

OTHER PUBLICATIONS

Van Dijk, L., Mileham, J., Malakhovsky, I., Laidler, D., Dekkers, H., Van Elshocht, S., Anberg, D., Owen, D. M., van Haren, R. (2017). Wafer-shape based in-plane distortion predictions using Superfast 4G metrology. Metrology, Inspection, and Process Control for Microlithography XXXI, 10145, 101452L. https://doi.org/10.1117/12.2257475.

*Primary Examiner* — Jason Berman
(74) *Attorney, Agent, or Firm* — Patterson & Sheridan, LLP (57) ABSTRACT

A method of depositing a backside film layer on a backside of a substrate includes loading a substrate having one or more films deposited on a front side of the substrate onto a substrate support of a processing chamber, depositing, from the sputter target, a target material on the backside of the substrate to form a backside layer on the backside of the substrate, and applying an RF bias to an electrode disposed within the substrate support while depositing the target material. The front side of the substrate faces the substrate support and is spaced from a top surface of the substrate support, and a backside of the substrate faces a sputter target of the processing chamber.

18 Claims, 4 Drawing Sheets

(51) Int. Cl.
*C23C 14/06* (2006.01)
*H01J 37/34* (2006.01)
*H01J 37/32* (2006.01)

(52) U.S. Cl.
CPC ...... *H01J 37/32715* (2013.01); *H01J 37/345* (2013.01); *H01J 37/3405* (2013.01); *H01L 21/0217* (2013.01); *H01L 21/02266* (2013.01)

(56) References Cited

U.S. PATENT DOCUMENTS

| | | | |
|---|---|---|---|
| 9,881,788 B2 | 1/2018 | Kim et al. | |
| 2005/0211547 A1* | 9/2005 | Hanawa | C23C 14/358 204/192.12 |
| 2008/0141942 A1* | 6/2008 | Brown | C23C 14/564 118/723 R |
| 2010/0247804 A1* | 9/2010 | Roy | C23C 14/345 427/569 |
| 2011/0220494 A1* | 9/2011 | Ding | H01J 37/3408 204/298.17 |
| 2015/0340225 A1* | 11/2015 | Kim | C23C 16/44 438/694 |

\* cited by examiner

METHOD AND CHAMBER FOR BACKSIDE PHYSICAL VAPOR DEPOSITION

CROSS-REFERENCE TO RELATED APPLICATIONS

This application claims the benefit to U.S. Provisional Application No. 62/892,411, filed Aug. 27, 2019, which is incorporated by reference herein.

FIELD

Embodiments of the present disclosure generally relate to a method and an apparatus, and more specifically, to a method and a cluster tool for film layer deposition on the back of substrates.

BACKGROUND

In semiconductor manufacturing, overlay requirements in a sequence of lithography patterning steps have become tight, due to increasing patterning density formed on a wafer. Overlay errors (pattern-to-pattern misalignments) are largely due to distortions of a wafer induced by non-lithography processes, such as etching, thin film deposition, and chemical mechanical planarization (CMP), between lithography steps, which may introduce stress or change stress in films on a surface of a wafer. When the induced stress is uniform over the wafer, the distortions are linear and radially symmetric. This type of symmetric and linearly uniform distortions can be corrected by various conventional methods, such as adding a backside film layer on the opposite surface of the wafer and conventional linear wafer alignment techniques, even if the distortions vary in magnitude wafer to wafer. However, non-uniform stress on the wafer causes local magnification changes in the wafer, i.e., higher order in-plane distortion (IPD), which in turn relates to higher order overlay error. This type of higher order distortions cannot be corrected by the conventional correction methods.

Therefore, there is a need for an apparatus and method that allows for lowering higher-order in-plane distortions on a film layer deposited on a wafer due to non-uniform stress without affecting a surface of the wafer.

SUMMARY

In one embodiment, a method of depositing a backside film layer on a backside of a substrate is provided that includes loading a substrate having one or more films deposited on a front side of the substrate onto a substrate support of a processing chamber, depositing, from the sputter target, a target material on the backside of the substrate to form a backside layer on the backside of the substrate, and applying an RF bias to an electrode disposed within the substrate support while depositing the target material. The front side of the substrate faces the substrate support and is spaced from a top surface of the substrate support, and a backside of the substrate faces a sputter target of the processing chamber.

In another embodiment, a method of depositing a backside film layer on a backside of a substrate is provided that includes loading a substrate having one or more films deposited on a front side of the substrate onto a substrate support of a processing chamber, depositing, from the sputter target, a target material on the backside of the substrate to form a backside layer on the backside of the substrate, applying an RF bias to an electrode disposed within the substrate support while depositing the target material, and applying a magnetic field, via a magnet disposed on the top surface of the substrate support, towards the sputter target during the depositing.

In another embodiment, a processing chamber for depositing a backside film layer on a backside of a substrate is provided that includes a bottom, sidewalls, and a lid defining a processing region, a sputter target comprising a target material and facing the processing region, a substrate support configured to support a substrate having one or more films deposited on a front side of the substrate, such that the front side of the substrate faces the substrate support and is spaced from a top surface of the substrate support, and a backside of the substrate faces the sputter target of the processing chamber, and an electrode disposed within the substrate support and configured to be biased by an RF source.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to methods and apparatus for depositing a backside film layer on a backside of a substrate while correcting higher order in-plane distortion and higher order overlay error due to non-uniform stress over the substrate induced by one or more films deposited on a front surface of the substrate. In a physical vapor deposition (PVD) chamber, a substrate is disposed on a substrate support with an air gap between the substrate and the substrate support and further an RF bias is applied during a deposition of a backside film layer. It has been shown that this configuration with an air gap and applied RF bias decreases higher order in plane distortion (IPD) and overlay errors.

As used herein, the term "about" refers to a +/−10% variation from the nominal value. It is to be understood that such a variation can be included in any value provided herein.

Figure 1:
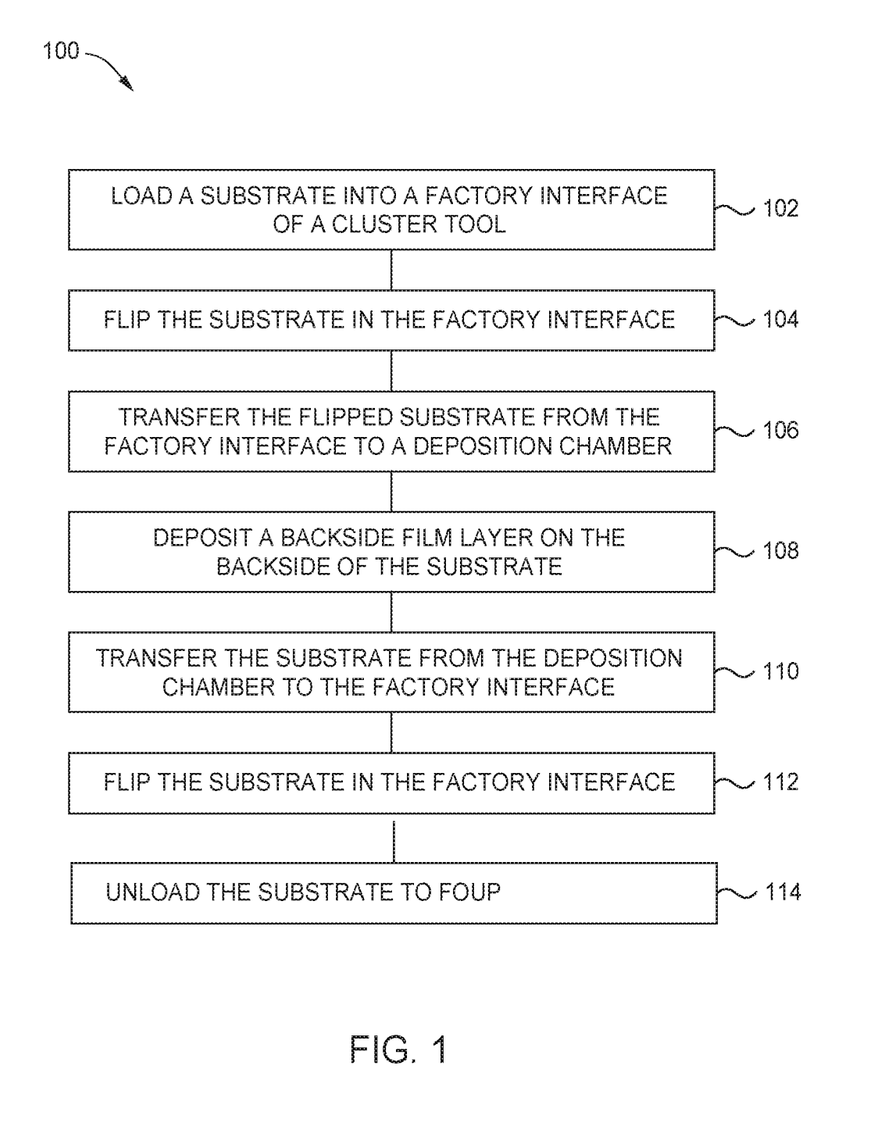
FIG. 1 illustrates a flow diagram of a method for depositing a film layer on a backside of a substrate according to one embodiment.
Figure 2:
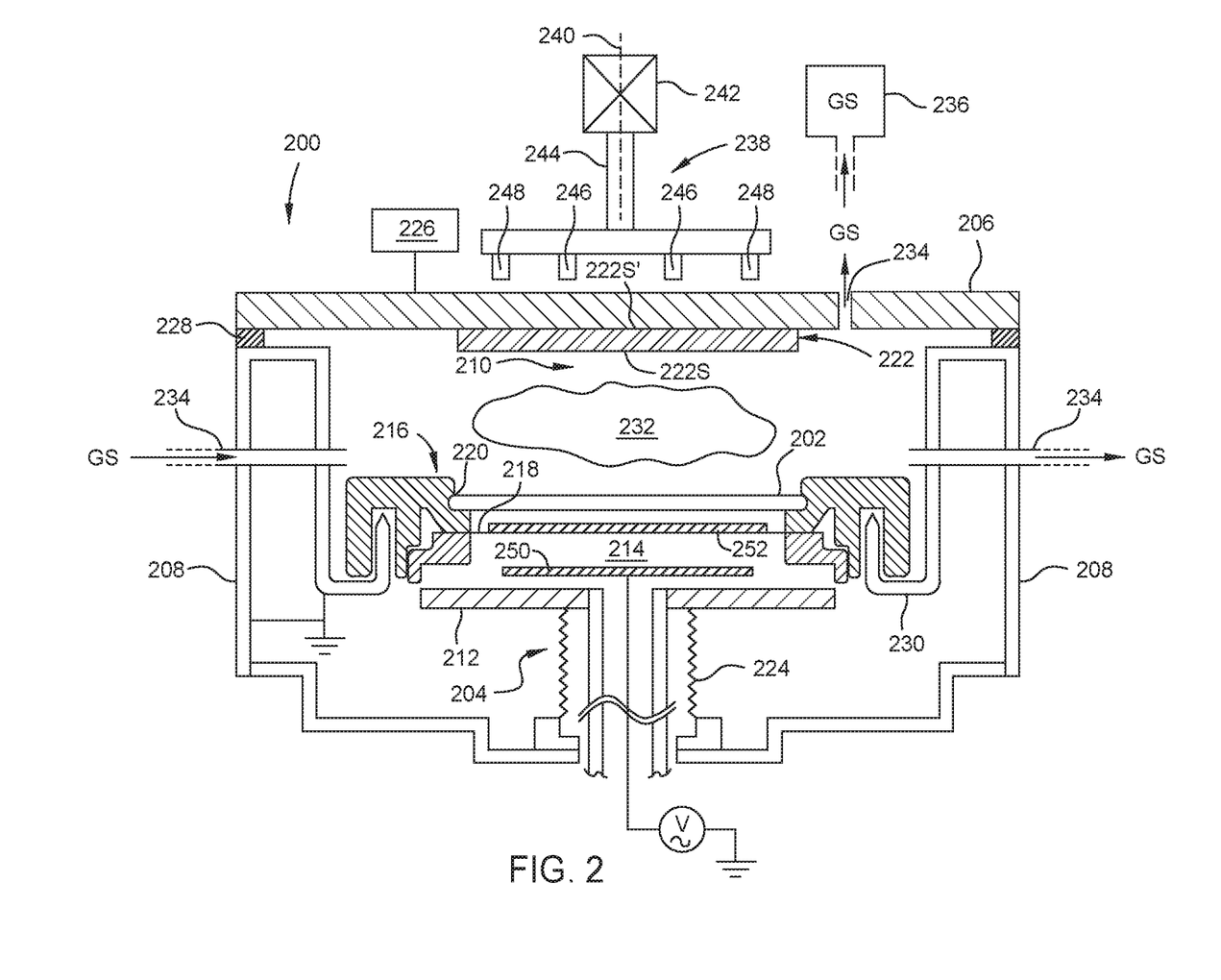
FIG. 2 depicts a schematic cross-sectional view of a physical vapor deposition (PVD) chamber according to one embodiment.
Figure 3:
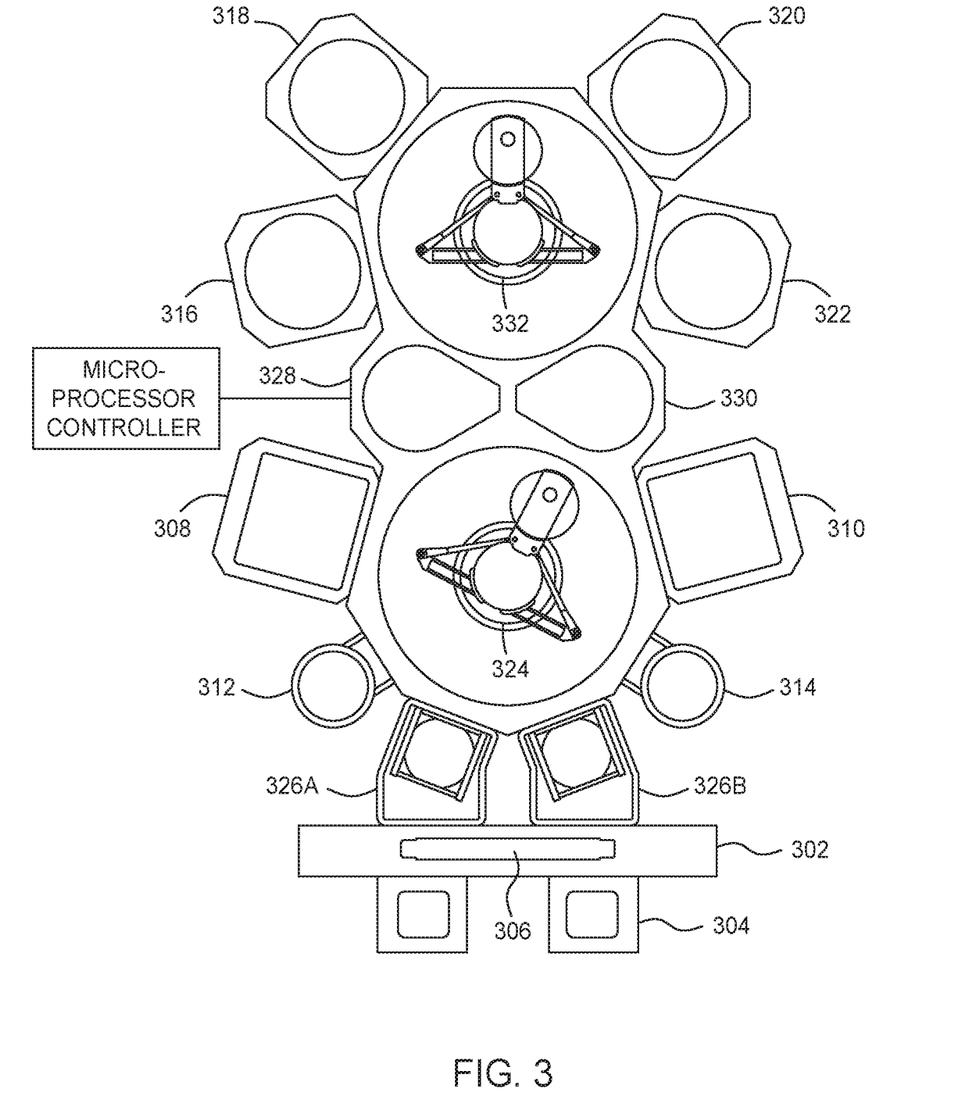
FIG. 3 illustrates a cluster tool including at least one PVD chamber according to one embodiment.

FIG. 1 illustrates a flow diagram of a method 100 for depositing a backside film layer on a backside of a substrate according to one embodiment. FIG. 2 depicts a schematic cross-sectional view of a physical vapor deposition (PVD) chamber 200 according to one embodiment. FIG. 3 illustrates a cluster tool 300 including at least one PVD chamber 200 according to one embodiment. The method operations in FIG. 1 are described in conjunction with FIGS. 2 and 3 to facilitate explanation of aspects of the disclosure. Persons skilled in the art will understand that any system configured to perform the method operations, in any order, falls within the scope of the embodiments described herein.

While in the example embodiments described below, a physical vapor deposition (PVD) chamber, such as the PVD chamber 200 is discussed, various process chambers for as chemical vapor deposition (CVD), plasma enhanced chemical vapor deposition (PECVD), atomic layer deposition (ALD), plasma enhanced atomic layer deposition (PEALD), low pressure chemical vapor deposition (LPCVD), or the like, are also contemplated. Examples of the cluster tool 300 are the Centura® system and the Endura® system available from Applied Materials, Inc., of Santa Clara, Calif.

The method 100 begins at block 102 by loading a substrate 202 into a factory interface 302 of the cluster tool 300. The factory interface 302 includes one or more front opening unified pod (FOUP) 304 for transporting substrates in and out of the cluster tool 300.

The substrate 202 may be a material such as crystalline silicon (e.g., Si <100> or Si <111>), silicon oxide, strained silicon, silicon germanium, doped or undoped polysilicon, doped or undoped silicon wafers and patterned or non-patterned wafers, such as silicon-on-insulator (SOI), carbon-doped silicon oxides, silicon nitride, germanium, gallium arsenide, glass, or sapphire wafers. The substrate 202 may have one or more film stacks deposited on the front side. The film stacks may be utilized to form gate structures for three dimensional (3D) NAND semiconductor applications. A film stack may include, but is not limited to, a stack with alternating oxide and nitride layers or a stack with alternating oxide and a silicon-containing layer (e.g., a polycrystalline silicon, an amorphous silicon layer, or a crystalline silicon).

At block 104, the substrate 202 is flipped over by a flipper 306 that may be attached to, or disposed in the factory interface 302 such that the front side (e.g., a side where one or more film stacks are deposited) of the substrate 202 faces downwards. In some embodiments, the flipper 306 is disposed within the PVD chamber 200. The flipper 306 includes a substrate handler/carrier (not shown) that may hold the substrate 202 at a bevel contact of the substrate 202 (i.e., at or near a periphery of the substrate 202). Therefore, the contact to the front side of the substrate 202 is limited to the bevel contact of the substrate 202. No physical contact is made to an active region fabricated with one or more film stacks deposited on the front side of the substrate 202. In various embodiments, the bevel contact of the substrate is at a radial distance of about 1 mm to about 5 mm, for example about 2 mm, from an outer edge of the substrate 202.

At block 106, the flipped substrate 202 is transferred from the factory interface 302 to the PVD chamber 200 that is one of the process chambers 308, 310, 312, 314, 316, 318, 320, 322 within the cluster tool 300. Each process chamber 308, 310, 312, 314 of the cluster tool 300 may be outfitted to perform a number of substrate processing operations including the PVD processes described herein, etch process, cyclical layer deposition (CLD), atomic layer deposition (ALD), chemical vapor deposition (CVD), pre-clean, degas, orientation, or the like. Any of the process chambers 308, 310, 312, 314, 316, 318, 320, 322 can be removed from the cluster tool 300 if not necessary for a particular process to be performed by the cluster tool 300.

If the PVD chamber 200 is one of a first set of the process chambers 308, 310, 312, 314, a first robot 324 transfers the substrate 202 between load lock chambers 326A, 326B and the one of the first set of the process chambers 308, 310, 312, 314. If the PVD chamber 200 is one of a second set of the process chambers 316, 318, 320, 322, the first robot 324 transfers the substrate 202 between the load lock chambers 326A, 326B and one or more intermediate transfer chambers 328, 330, and a second robot 332 transfers the substrate 202 between the intermediate transfer chambers 328, 330 and the one of the second set of the process chambers 316, 318, 320, and 322. The intermediate transfer chambers 328, 330 may be used to maintain ultrahigh vacuum conditions while allowing the substrate 202 to be transferred within the cluster tool 300.

The flipped substrate 202 is disposed and secured onto a substrate support 204 within the PVD chamber 200. The PVD chamber 200 includes a chamber lid 206 and sidewalls 208 that define a processing region 210. The processing region 210 is typically maintained at a pressure of between about 1 mTorr and about 20 Torr by a vacuum pump (not shown), for example, between about 3 mTorr and about 10 mTorr, or between about 2.5 mTorr and about 1 Torr.

The substrate support 204 includes a pedestal 212 and a susceptor 214. A shadow mask 216 may be disposed partially on a top surface 218 of the susceptor 214 (that is also a top surface of the substrate support 204) and defines a target deposition area on the backside of the substrate 202. The substrate 202 is disposed on the substrate support 204 at a distance of between about 0.1 mm and about 10 mm, for example, between about 1 mm and about 3 mm, or about 2 mm, from the top surface 218 of the susceptor 214, supported by substrate supporting mechanism 220 at the bevel contact of the substrate 202, thus creating an air gap between the substrate 202 and the top surface 218 of the susceptor 214. In some embodiments, the substrate supporting mechanism 220 is one or more clamps disposed on the shadow mask 216. When disposed on the substrate support 204, the front side of the substrate 202 faces downwards and is not in contact with the top surface 218 of the susceptor 214, while the backside of the substrate 202 faces upwards and is exposed to a sputter target 222 disposed on the chamber lid 206 within the processing region 210 of the PVD chamber 200. The sputter target 222 has a first surface 222S that is in contact with the processing region 210, and a second surface 222S' disposed on the chamber lid 206 opposite to the first surface 222S. In some embodiments, the bevel contact of the substrate 202 is supported by the substrate supporting mechanism 220 such that the backside of the substrate 202 is tilted with respect to the first surface 222S of the sputter target 222 by an angle of between 0 degree and about 1 degree. The pedestal 212 is connected to a lift mechanism 224 (e.g., an actuator) disposed through the bottom of the PVD chamber 200.

At block 108, a backside film layer is deposited on the backside of the substrate 202 in the PVD chamber 200. The backside film layer may be a dielectric layer with compressive or tensile stress, depending on stress profiles on the front side of the substrate 202. For example, if one or more film stacks deposited on the front side of the substrate 202 are tensile strained, the backside film layer should also be tensile strained to compensate the stress on the front side of the substrate 202, resulting in reduced overall stress on the substrate 202 and thus reducing bow of the substrate 202. In some embodiments, the backside film layer includes silicon, such as silicon nitride (SiN). In some embodiments, the backside film layer includes metal such as chromium (Cr).

During the backside film layer deposition process, the chamber lid 206 of the PVD chamber 200 is negatively biased by a power source 226. An insulator ring 228 electrically isolates the chamber lid 206 from the remainder of the PVD chamber 200 that is grounded via an annular shield member 230, and thus the negative bias is applied to the sputter target 222. The annular shield member 230 at least partially encloses a portion of the processing region 210. The power source 226 may be any type of power source, including direct current (DC), pulsed DC, RF, alternating current (AC), and any combinations thereof.

In some embodiments, the power source 226 is a DC power source that delivers DC bias at a power level of between about 50 W and about 10000 W, for example between about 100 W and about 5000 W. In some embodiments, the power source 226 is an RF power source that delivers RF bias at a power level of between about 300 W and 800 W, for example, about 500 W. The frequency of the RF power may be between about 10 MHz and about 30 MHz, for example, about 13.56 MHz. In some embodiments, the power source 226 delivers DC bias and RF bias, where a ratio of delivered RF power to delivered DC power is between about 2:1 and about 8:1, for example, between about 4:1 and about 6:1. In some embodiments, the power source 226 is a DC power source that delivers pulsed DC bias at a voltage of between about 2000 V and about 60000 V, a time duration of between about 10 μs and about 40 μs, and a pulse cycle time of about 200 μs.

The sputter target 222 provides a sputtering surface that is positioned at the first surface 222S to deposit target material, such as silicon, dielectric material, or metal, onto a top surface of the substrate 202. The negative bias applied to the sputter target 222 by the power source 226 via the chamber lid 206 excites an inert gas, such as argon (Ar), krypton (Kr), or the like and a process gas, such as a nitrogen-containing gas (e.g., $N_2$) for nitride deposition, within the processing region 210 forming a plasma 232. The formed plasma 232 produces positively ionized species that bombard the sputtering surface, and the target material from the sputter target 222 is deposited onto a top surface of the substrate 202 to form a backside film layer (e.g., silicon-containing layer such as SiN). The inert gas and any processing gas may be introduced into the processing region 210 of the PVD chamber 200 via gas conduits 234 disposed on the sidewalls 208 and/or the chamber lid 206. A gas source 236 is in fluid communication with the gas conduits 208, such that the gas source 236 supplies the process gas to the sputter target 222. In some embodiments, sputtering rate of the backside film layer deposition process is about 1 Å/s to about 50 Å/s, for example 5 Å/s to about 25 Å/s, or about 24 Å/s when the DC bias is applied by the power source 226 at a power of 9 kW and 5 Å/s when the DC bias is at a power of 1 kW.

In some embodiments, a magnetron 238 is disposed adjacent to the chamber lid 206 above the second surface 220S' of the sputter surface 220 and rotatable about a central axis 240 of the chamber lid 206 by a magnetron actuator 242. The magnetron 238 in the PVD chamber 200 projects a magnetic field into the processing region 210 towards the substrate support 204, and thus increases the sputtering rate and ionization fraction of the target material from the sputter target 222. The magnetron actuator 242 is coupled to the magnetron 238 by a magnetron shaft 244. In some embodiments, the magnetron 238 has an unbalanced magnet configuration, including an inner pole 246 with a plurality of magnets of one magnetic polarity, and an outer pole 248 with a plurality of magnets of the opposite magnetic polarity, which surround the inner pole 246. A ratio of strength of inner magnetic field created by the inner pole 246 to strength of an outer magnetic field created by the outer pole 248 may be between about 0.2 and about 3, for example, between about 0.55 and about 0.73. Such unbalanced magnet configuration increases the magnetic field strength at certain portions of the magnetron 238, which creates more ionized species in the formed plasma 232. It is contemplated that the ratio may be adjusted to change the sputtering rate and ionization fraction of the target material from the sputter target 222.

In some embodiments, the substrate 202 may be subjected to a post annealing process to further adjust the stress level of the backside film layer. For example, the substrate 202 may be subjected to an anneal process by heating the substrate 202 to a temperature of about 500° C. or above, for example, between about 750° C. and about 950° C., for between about 1 minute and about 180 minutes, for example, between about 3 minutes and about 15 minutes. In one example, the substrate 202 is heated to a temperature of about 650° C. for about 180 minutes. In another example, the substrate 202 is heated to a temperature of about 850° C. for about 3 minutes. In some embodiments, the backside film layer may be subjected to photolithography before the annealing. The annealing and deposition process may be repeated multiple times.

In some embodiments, a backside film layer as-deposited shows radial symmetric local compressive stress on the substrate 202 with up to about 2 GPa to 3 GPa and high stress retention of about 50%, for example about 60%, post annealing. The thickness of the backside film layer varies between about 0.1 μm and about 3 μm, for example, about 0.2 μm to about 0.7 μm based on the stress profiles on the front side of the substrate 202. The thickness of the backside film layer may be selected at which the substrate bow is corrected and negligible (e.g., between about 200 μm and about 1000 μm of bow).

In some embodiments, the PVD chamber 200 includes an electrode 250 within the susceptor 214 to which an RF bias may be applied. Alternatively, a RF bias may be applied to the pedestal 212. While not intending to be bound by theory, it is believed the RF bias applied to the electrode 250 or the pedestal 212 may attract and accelerate positively ionized species in the plasma 232 to promote bombardment of the ionized species on the backside of the substrate 202 (i.e. pinning effect). In some embodiments, the RF bias may have a power level of between about 50 W and about 1500 W, for example between about 300 W and about 500 W. The frequency of the RF bias may be between about 200 kHz and about 60 MHz.

In some embodiments, the PVD chamber 200 includes a magnet 252 disposed on the top surface 218 of the susceptor 214. The magnet 252 creates a magnetic field towards the substrate 202, thus increasing the sputtering rate and ionization of the target material from the sputter target 222 onto the backside of the substrate 202. Thus, modifying configuration of the magnet 252, such as a location relative to the substrate 202 and a shape of the magnet 252, thus modifying a magnetic field distribution towards the substrate 202, may effectively modulate a thickness and IPD at certain locations of the substrate 202.

At block 110, the substrate 202 having the backside film layer deposited is transferred from the PVD chamber 200 back to the factory interface 302. The substrate 202 is transferred without contacting the front side of the substrate 202.

At block 112, the substrate is then flipped again at the factory interface 302 so that the backside film layer of the substrate 202 faces downwards.

At block 114, the substrate having the PVD deposited backside film layer is unloaded to the front opening unified pod (FOUP) 304. Alternatively, the substrate 202 having the backside film layer deposited may be transferred to one or more process chambers 308, 308, 312, 314, 316, 318, 320, 322 within the cluster tool 300 for further processing.

Figure 4:
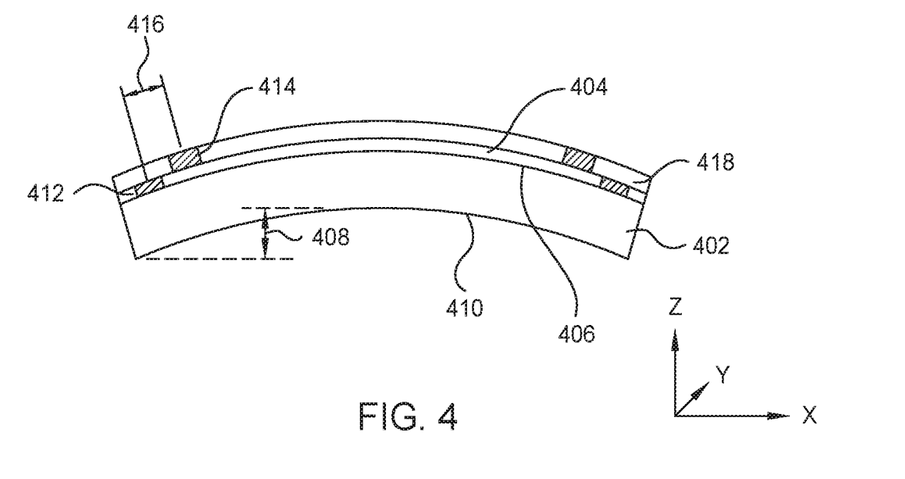
FIG. 4 illustrates a schematic view of a wafer according to one embodiment.

FIG. 4 illustrates a schematic view of a wafer 402 having one or more film layers 404 formed on a front side 406 of the wafer 402 that exerts compressive stress on the wafer 402. Another film layer 418 may be deposited on the one or more film layers 404 by a subsequent deposition process.

When the distance between the wafer 402 and the top surface 218 of the susceptor 214 is about 0 mm (i.e., no air gap between the wafer 402 and the top surface 218 of the susceptor 214), bowing 408 of a backside 410 of the wafer 402 is increased by about 40% as an RF bias at 300 W is applied to the susceptor 214 (thus to the wafer 402) as compared with when no RF bias is applied, as evidenced by measured data shown in Table I. With the RF bias at 300 W, higher order in-plane distortions (IPD) in the x-direction and y-direction (i.e., displacements of a grid 412 on the wafer 402 in the x-direction and y-direction on the front side 406 of the wafer 402 due to bowing that is uncorrectable by a linear alignment technique) and high-order wafer alignment (HOWA) (i.e., overlay error 416 between the grid 412 and a grid 414 on a film layer 418 deposited on the one or more film layers 404) are decreased by about 30% to 40%. Therefore, a thickness of a backside film layer to be deposited on the backside 410 of the wafer 402 for correcting certain bowing can be reduced by applying the RF bias. A reduced thickness of the backside film layer also reduces higher order IPD of the backside film layer on the backside 410 of the wafer 402.

TABLE I

| Distance/RF bias | Bow (μm) | IPD (nm) | HOWA (nm) |
|---|---|---|---|
| 0 mm/0 W | −254 | 15.33/16.86 | 2.94/3.15 |
| 0 mm/300 W | −355 | 10.17/12.26 | 1.74/2.06 |

When an RF bias at 300 W is applied to the susceptor 214, the decrease in the higher order IPD and HOWA due to the applied RF bias at shown in Table I is substantially maintained when the distance between the wafer 402 and the top surface 218 of the susceptor 214 is about 1 mm (i.e., 1 mm air gap between the wafer 402 and the top surface 218 of the susceptor 214), as evidenced by measured data shown in Table II. Therefore, an RF bias can be effectively applied to a wafer with an air gap between the wafer and the top surface 218 of the susceptor 214, leading to the reduction in the higher order IPD and HOWA, without the wafer 402 touching the top surface 218 of the susceptor 214. When the wafer 402 is flipped such that the front side 406 faces the top surface 218 of the susceptor 214, for example, when a backside film layer is deposited on the backside 410 of the wafer 402, an RF bias can be applied to the susceptor 214 to correct the higher order IPD and HOWA in the backside film layer, without the front side 406 of the wafer 402 touching the top surface 218 of the susceptor 214.

TABLE II

| Distance/RF bias | Bow (μm) | IPD (nm) | HOWA (nm) |
|---|---|---|---|
| 0 mm/300 W | −355 | 10.17/12.26 | 1.74/2.06 |
| 1 mm/300 W | −337 | 10.39/10.88 | 2.16/2.22 |

When the distance between the wafer 402 and the top surface 218 of the susceptor 214 is about 2 mm, higher order IPD is decreased by about 17% and HOWA is decreased by about 7% as the power of the RF bias is increased from 300 W to 500 W as shown in Table III. Thus, an RF bias with a higher power is more effective in reducing higher order IPD and HOWA.

TABLE III

| Distance/RF bias | Bow (μm) | IPD (nm) | HOWA (nm) |
|---|---|---|---|
| 2 mm/300 W | −356 | 11.84/13.01 | 1.83/1.80 |
| 2 mm/500 W | −327 | 9.87/10.70 | 1.71/1.67 |

When the distance between the wafer 402 and the top surface 218 of the susceptor 214 is about 2 mm and the wafer 402 is tilted with respect to the top surface 218 of the susceptor 214 by an angle between 0 degree and 1 degree, the bowing is slightly increased and IPD and HOWR are also increased as compared to the wafer 402 disposed in parallel to the top surface 218 with respect to the top surface 218 of the susceptor 214, as shown in Table IV. The tilting of the wafer 402 may be used to deposit a backside film layer on a backside of the wafer to compensate uneven stress caused by uneven films deposed on a front side of the wafer.

TABLE IV

| Distance/RF bias | Bow (μm) | IPD (nm) | HOWA (nm) |
|---|---|---|---|
| 2 mm no Tilt/300 W | −356 | 11.84/13.01 | 1.83/1.80 |
| 2 mm Tilt/300 W | −350 | 17.51/15.92 | 2.15/2.09 |

According to the embodiments described above, a backside film layer is deposited on a backside of a substrate having one or more film layers on a front side of the substrate in a PVD chamber, where the substrate is disposed on a substrate support with an air gap between the substrate and the substrate support and further an RF bias is applied during a deposition of a backside film layer. This configuration with an air gap and applied RF bias has been shown to decrease higher order IPD and overlay errors.

While the foregoing is directed to embodiments of the present disclosure, other and further embodiments of the present disclosure can be devised without departing from the basic scope thereof, and the scope thereof is determined by the claims that follow.

The invention claimed is:

1. A method of depositing a backside film layer on a backside of a substrate, comprising:
   loading a substrate having one or more films deposited on a front side of the substrate onto a substrate support of a processing chamber, the processing chamber having a chamber lid, and sidewalls that are electrically isolated from the chamber lid, wherein:
   the front side of the substrate faces the substrate support and is spaced from a top surface of the substrate support, and
   a backside of the substrate faces a sputter target disposed on the chamber lid of the processing chamber;

depositing, from the sputter target, a target material on the backside of the substrate to form a backside layer on the backside of the substrate; and applying an RF bias to an electrode disposed within the substrate support while depositing the target material, wherein the chamber lid and the sputter target are negatively biased and the sidewalls are grounded, and wherein the substrate is supported by a shadow mask disposed on the substrate support, the shadow mask having a substrate support mechanism configured to clamp the substrate and maintain the substrate spaced at a distance of between 1 mm and 3 mm from the top surface of the substrate support during the depositing of the backside layer.

2. The method of claim 1, wherein the target material comprises silicon and a process gas used during the depositing comprises nitrogen-containing gas.

3. The method of claim 2, wherein the backside film layer comprises silicon nitride and has a thickness of between 0.1 μm and 1 μm.

4. The method of claim 1, wherein loading a substrate comprises positioning the substrate at a distance of between 1 mm and 3 mm spaced from the top surface of the substrate support and parallel to the top surface of the substrate support.

5. The method of claim 1, wherein loading a substrate comprises positioning the substrate at a distance of between 1 mm and 3 mm spaced from the top surface of the substrate support tilted with respect to the top surface of the substrate support by an angle between 0 degree and 1 degree.

6. The method of claim 1, wherein the RF bias is applied to the electrode at a power of between about 50 W and about 10000 W.

7. The method of claim 1, wherein the RF bias is applied to the electrode at a frequency between about 200 kHz and about 60 MHz.

8. A method of depositing a backside film layer on a backside of a substrate, comprising:
   loading a substrate having one or more films deposited on a front side of the substrate onto a substrate support of a processing chamber, the processing chamber having a chamber lid, and sidewalls that are electrically isolated from the chamber, wherein:
      the front side of the substrate faces the substrate support and is spaced from a top surface of the substrate support, and
      a backside of the substrate faces a sputter target disposed on the chamber lid of the processing chamber;
   depositing, from the sputter target, a target material on the backside of the substrate to form a backside layer on the backside of the substrate;
   applying an RF bias to an electrode disposed within the substrate support while depositing the target material, wherein the chamber lid and the sputter target are negatively biased and the sidewalls are grounded; and
   applying a magnetic field, via a magnet disposed on the top surface of the substrate support, towards the sputter target during the depositing, wherein the substrate is supported by a shadow mask disposed on the substrate support, the shadow mask having a substrate support mechanism configured to clamp the substrate and maintain the substrate spaced at a distance of between 1 mm and 3 mm from the top surface of the substrate support during the depositing.

9. The method of claim 8, wherein the target material comprises silicon and a process gas used during the depositing comprises nitrogen-containing gas.

10. The method of claim 8, wherein loading a substrate comprises positioning the substrate at a distance of between 1 mm and 3 mm spaced from the top surface of the substrate support.

11. The method of claim 8, wherein the RF bias is applied to the electrode at a power of between about 50 W and about 10000 W.

12. The method of claim 8, wherein the RF bias is applied to the electrode at a frequency between about 200 kHz and about 60 MHz.

13. A processing chamber for depositing a backside film layer on a backside of a substrate, comprising:
   a bottom, sidewalls, and a lid defining a processing region, wherein the sidewalls are electrically isolated from the lid;
   a sputter target disposed on the chamber lid, the sputter target comprising a target material and facing the processing region;
   a substrate support;
   a shadow mask disposed on the substrate support, the shadow mask having a substrate supporting mechanism configured to clamp a substrate having one or more films deposited on a front side of the substrate, such that:
      the front side of the substrate faces the substrate support and is configured to be spaced at a distance of between 1 mm and 3 mm from a top surface of the substrate support during processing, and
      a backside of the substrate faces the sputter target of the processing chamber; and
   an electrode disposed within the substrate support and configured to be biased by an RF source, wherein the sputter target and the lid are negatively biased, and the sidewalls are grounded.

14. The processing chamber of claim 13, further comprising:
   a magnet disposed on the top surface of the substrate support, towards the sputter target.

15. The processing chamber of claim 13, wherein loading a substrate comprises positioning the substrate at a distance of between 1 mm and 3 mm spaced from the top surface of the substrate support and parallel to the top surface of the substrate support.

16. The processing chamber of claim 13, wherein loading a substrate comprises positioning the substrate at a distance of between 1 mm and 3 mm spaced from the top surface of the substrate support tilted with respect to the top surface of the substrate support by an angle between 0 degree and 1 degree.

17. The processing chamber of claim 13, wherein the RF bias is applied to the electrode at a power of between about 50 W and about 10000 W.

18. The processing chamber of claim 13, wherein the RF bias is applied to the electrode at a frequency between about 200 kHz and about 60 MHz.

* * * * *